(12) United States Patent
Yamaguchi et al.

(10) Patent No.: US 10,249,818 B1
(45) Date of Patent: Apr. 2, 2019

(54) MEMORY ELEMENT

(71) Applicant: Toshiba Memory Corporation, Minato-ku (JP)

(72) Inventors: Marina Yamaguchi, Yokkaichi (JP); Shosuke Fujii, Kobe (JP); Riichiro Takaishi, Kawasaki (JP); Yuuichi Kamimuta, Yokkaichi (JP); Shoichi Kabuyanagi, Yokkaichi (JP); Masumi Saitoh, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/912,613

(22) Filed: Mar. 6, 2018

(30) Foreign Application Priority Data

Sep. 19, 2017 (JP) ................. 2017-179560

(51) Int. Cl.
| | |
|---|---|
| *H01L 45/00* | (2006.01) |
| *H01L 27/24* | (2006.01) |
| *G11C 11/22* | (2006.01) |
| *H01L 49/02* | (2006.01) |

(52) U.S. Cl.
CPC .......... *H01L 45/10* (2013.01); *H01L 27/2481* (2013.01); *H01L 45/1233* (2013.01); *H01L 45/146* (2013.01); *G11C 11/221* (2013.01); *H01L 28/56* (2013.01); *H01L 28/75* (2013.01)

(58) Field of Classification Search
CPC ... H01L 45/10; H01L 45/1233; H01L 45/146; H01L 27/2481; H01L 28/56; H01L 28/75; G11C 11/221
See application file for complete search history.

(56) References Cited

U.S. PATENT DOCUMENTS

| | | | |
|---|---|---|---|
| 8,343,813 B2 | 1/2013 | Kuse et al. | |
| 8,354,660 B2 * | 1/2013 | Sekar | H01L 45/145 257/290 |
| 8,389,971 B2 | 3/2013 | Chen et al. | |
| 8,520,424 B2 | 8/2013 | Kreupl et al. | |
| 8,598,564 B2 * | 12/2013 | Sakotsubo | G11C 13/0004 257/4 |
| 9,041,997 B2 * | 5/2015 | Takahashi | G02F 1/155 359/266 |

(Continued)

FOREIGN PATENT DOCUMENTS

| | | |
|---|---|---|
| JP | 2012-523711 | 10/2012 |
| JP | 2013-522912 | 6/2013 |

(Continued)

*Primary Examiner* — Ida M Soward
(74) *Attorney, Agent, or Firm* — Oblon, McClelland, Maier & Neustadt, L.L.P.

(57) ABSTRACT

According to one embodiment, a memory element includes a first layer, a second layer, and a third layer. The first layer is conductive. The second layer is conductive. The third layer includes hafnium oxide and is provided between the first layer and the second layer. The first layer includes a first region, a second region, and a third region. The first region includes a first element and a first metallic element. The first element is selected from a group consisting of carbon and nitrogen. The second region includes a second metallic element and is provided between the first region and the third layer. The third region includes titanium oxide and is provided between the second region and the third layer.

18 Claims, 10 Drawing Sheets

(56) References Cited

U.S. PATENT DOCUMENTS

| | | | |
|---|---|---|---|
| 9,627,061 B2* | 4/2017 | Yoon | G11C 13/0069 |
| 9,761,798 B2* | 9/2017 | Kamimuta | H01L 45/04 |
| 2002/0000597 A1* | 1/2002 | Okazawa | B82Y 10/00 |
| | | | 257/298 |
| 2014/0346435 A1* | 11/2014 | Wu | H01L 45/08 |
| | | | 257/5 |
| 2015/0207071 A1* | 7/2015 | Ode | H01L 27/2481 |
| | | | 257/4 |
| 2015/0333258 A1* | 11/2015 | Fujii | G11C 11/22 |
| | | | 257/421 |
| 2016/0099303 A1* | 4/2016 | Phatak | H01L 28/75 |
| | | | 257/532 |
| 2016/0359109 A1 | 12/2016 | Kamimuta et al. | |

FOREIGN PATENT DOCUMENTS

| | | |
|---|---|---|
| JP | 2013-534723 | 9/2013 |
| JP | 2015-061019 | 3/2015 |
| JP | 2017-005061 | 1/2017 |

* cited by examiner

MEMORY ELEMENT

CROSS-REFERENCE TO RELATED APPLICATIONS

This application is based upon and claims the benefit of priority from Japanese Patent Application No. 2017-179560, filed on Sep. 19, 2017; the entire contents of which are incorporated herein by reference.

FIELD

Embodiments described herein relate generally to a memory element.

BACKGROUND

A memory element and a memory device that use a variable resistance element including a ferroelectric have been proposed. It is desirable for the on-current of such a memory element to be large.

DETAILED DESCRIPTION

Figure 1:
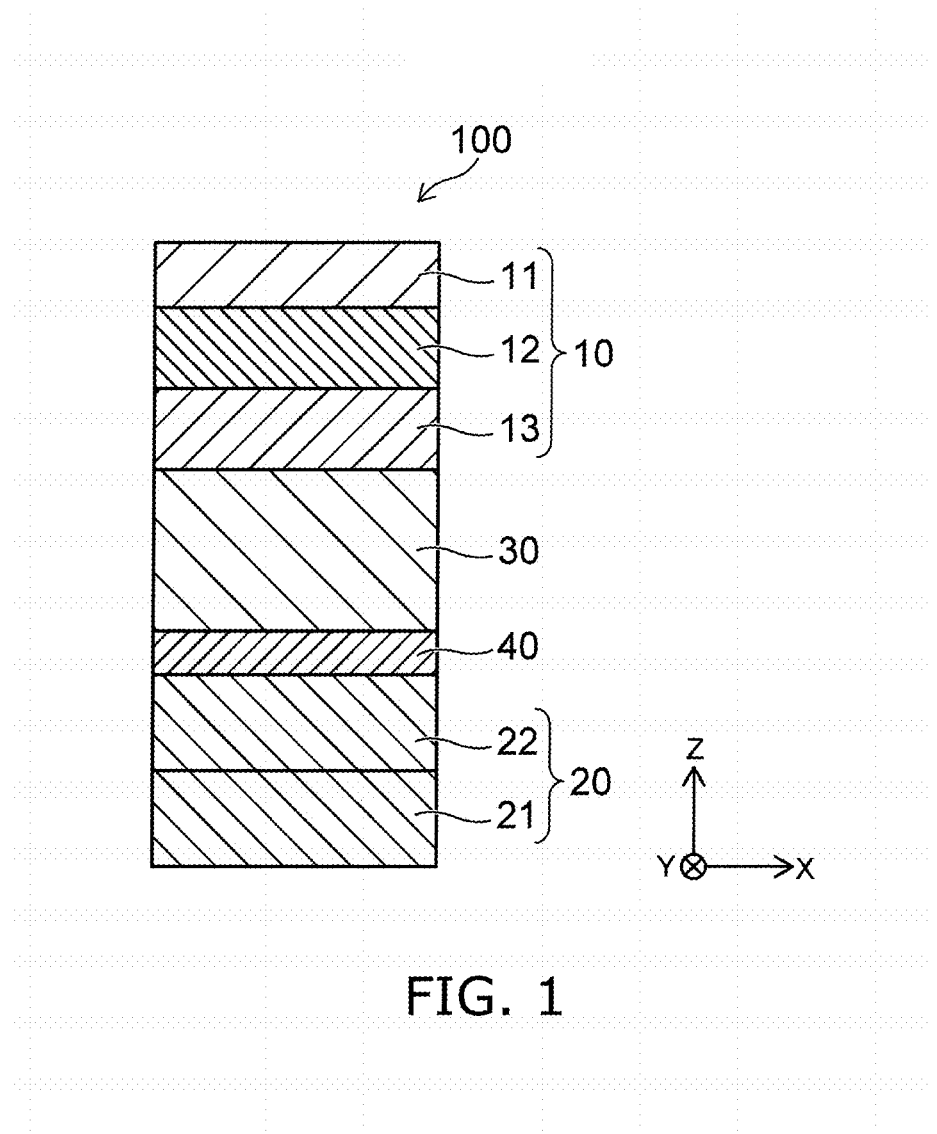
FIG. 1 is a schematic cross-sectional view illustrating a memory element according to an embodiment.

According to one embodiment, a memory element includes a first layer, a second layer, and a third layer. The first layer is conductive. The second layer is conductive. The third layer includes hafnium oxide and is provided between the first layer and the second layer. The first layer includes a first region, a second region, and a third region. The first region includes a first element and a first metallic element. The first element is selected from a group consisting of carbon and nitrogen. The second region includes a second metallic element and is provided between the first region and the third layer. The third region includes titanium oxide and is provided between the second region and the third layer.

Various embodiments will be described hereinafter with reference to the accompanying drawings.

The drawings are schematic or conceptual; and the relationships between the thicknesses and widths of portions, the proportions of sizes between portions, etc., are not necessarily the same as the actual values thereof. Further, the dimensions and/or the proportions may be illustrated differently between the drawings, even for identical portions.

In the drawings and the specification of the application, components similar to those described in regard to a drawing thereinabove are marked with like reference numerals, and a detailed description is omitted as appropriate.

FIG. 1 is a schematic cross-sectional view illustrating a memory element according to an embodiment.

As shown in FIG. 1, the memory element 100 according to the embodiment includes a first layer 10, a second layer 20, and a third layer 30.

The memory element 100 is, for example, a nonvolatile memory element. The memory element 100 is, for example, one memory cell of a FTJ (Ferroelectric Tunnel Junction) memory utilizing a ferroelectric.

At least a portion of the first layer 10 is a conductive layer that is conductive. The first layer 10 is, for example, an upper electrode of the memory element 100. The first layer 10 includes a metallic element. The first layer 10 may include a first element. The first element includes at least one selected from the group consisting of C (carbon) and N (nitrogen).

At least a portion of the second layer 20 is a conductive layer that is conductive. The second layer 20 is, for example, a lower electrode of the memory element 100. The second layer 20 includes a second element. The second element includes at least one selected from the group consisting of silicon (Si), Ge (germanium), Ta (tantalum), Nb (niobium), V (vanadium), W (tungsten), Fe (iron), Mo (molybdenum), Co (cobalt), Ni (nickel), Ru (ruthenium), Ir (iridium), Cu (copper), Pd (palladium), Ag (silver), Pt (platinum), and Ti (titanium). The second layer 20 includes, for example, at least one of a semiconductor layer, a metal layer, or a metal compound layer.

In the example, the second layer 20 includes a first lower electrode layer 21 and a second lower electrode layer 22. The first lower electrode layer 21 includes TiN (titanium nitride). The second lower electrode layer 22 is provided between the first lower electrode layer 21 and the third layer 30. The second lower electrode layer 22 includes polycrystalline silicon to which an n-type impurity such as P (phosphorus) or the like is added.

The third layer 30 is provided between the first layer 10 and the second layer 20. For example, the third layer 30 contacts the first layer 10. The third layer 30 includes a ferroelectric. In the example, the third layer 30 includes hafnium oxide as the ferroelectric. The thickness (the length along a Z-axis direction) of the third layer 30 is, for example, not less than 1 nm and not more than 10 nm.

The memory element 100 further includes a fourth layer 40 provided between the second layer 20 and the third layer 30. For example, the fourth layer 40 contacts the second layer 20 and the third layer 30. The fourth layer 40 is, for example, a paraelectric layer. The fourth layer 40 includes a third element. The third element includes at least one selected from the group consisting of silicon, aluminum, tantalum, and tungsten. The fourth layer 40 includes at least one of an oxide or a metal oxide of a semiconductor. The fourth layer 40 includes, for example, at least one of silicon oxide, aluminum oxide, tantalum oxide, or tungsten oxide. The thickness (the length along the Z-axis direction) of the fourth layer 40 is, for example, not less than 1 nm and not more than 10 nm.

The direction from the second layer 20 toward the first layer 10 is taken as the Z-axis direction (a first direction). One direction perpendicular to the Z-axis direction is taken as an X-axis direction. A direction perpendicular to the Z-axis direction and perpendicular to the X-axis direction is taken as a Y-axis direction.

The memory element 100 includes a variable resistance layer provided between the upper electrode (the first layer 10) and the lower electrode (the second layer 20) and is a two-terminal FTJ element. The third layer 30 and the fourth layer 40 correspond to the variable resistance layer. The polarization of the ferroelectric is changed by a voltage applied between the first layer 10 and the second layer 20. Thereby, the electrical resistance of the memory element 100 (the electrical resistance between the first layer 10 and the second layer 20) changes. In other words, the on-state in which the electrical resistance of the memory element 100 is low and the off-state in which the electrical resistance of the memory element 100 is high are switched.

As shown in FIG. 1, the first layer 10 includes a first region 11, a second region 12, and a third region 13.

The first region 11 includes a first metallic element. The first metallic element includes, for example, at least one selected from the group consisting of titanium, tantalum, and tungsten. For example, the first region 11 suppresses reactions between the second region 12 and an interconnect layer (described below) provided on the first region 11. In the example, the first region 11 includes a first element (e.g., nitrogen) described above. In the example, the first region 11 is titanium nitride. The thickness (the length along the Z-axis direction) of the first region 11 is, for example, not less than 1 nm and not more than 50 nm. The material of the first region 11 may be the same as or different from the material of the third region 13.

The second region 12 is provided between the first region 11 and the third layer 30. For example, the second region 12 is continuous with the first region 11 or in contact with the first region 11. The second region 12 includes a second metallic element and oxygen. The second metallic element includes, for example, at least one selected from the group consisting of Ti (titanium), Ce (cerium), Eu (europium), Zr (zirconium), Ba (barium), Al (aluminum), Hf (hafnium), Sr (strontium), La (lanthanum), Mg (magnesium), Nd (neodymium), Yb (ytterbium), Sm (samarium), Dy (dysprosium), Lu (lutetium), Ho (holmium), Tm (thulium), Er (erbium), Ca (calcium), and Y (yttrium). The second metallic element may be the same as the first metallic element or may be different from the first metallic element. In the example, the second region 12 is titanium. The second region 12 may include titanium oxide and/or titanium nitride. The thickness (the length along the Z-axis direction) of the second region 12 is, for example, not less than 1 nm and not more than 10 nm.

The third region 13 is provided between the second region 12 and the third layer 30. For example, the third region 13 is continuous with the second region 12 or in contact with the second region 12. For example, the third region 13 contacts the third layer 30. The third region 13 includes titanium and oxygen. The third region 13 includes, for example, titanium oxide. The titanium oxide that is included in the third region 13 is, for example, tetragonal (rutile-type) titanium dioxide. For example, the third region 13 suppresses reactions between the third layer 30 and the second region 12. The thickness (the length along the Z-axis direction) of the third region 13 is, for example, not less than 1 nm and not more than 10 nm.

For example, the third region 13 does not include the first element (e.g., nitrogen). Or, for example, the third region 13 includes the first element; and the concentration of the first element in the third region 13 is lower than the concentration of the first element in the first region 11.

For example, the second region 12 does not include the first element. Or, for example, the second region 12 includes the first element; and the concentration of the first element in the second region 12 is higher than the concentration of the first element in the third region 13 and lower than the concentration of the first element in the first region 11.

The oxygen concentration in the third region 13 is, for example, higher than the oxygen concentration in the second region 12. For example, the first region 11 does not include oxygen. Or, for example, the first region 11 includes oxygen; and the oxygen concentration in the first region 11 is lower than at least one of the oxygen concentration in the second region 12 or the oxygen concentration in the third region 13.

For example, the concentrations in the embodiment are concentrations (atoms/cm$^3$) measured by SIMS (Secondary Ion Mass Spectrometry). The concentration (atomic %) and the composition of each layer and/or each region may be measured by TEM-EDX (energy dispersive X-ray spectrometry), TEM-EELS (electron energy loss spectrometry), etc.

A first layer 10 such as that described above is stacked on the second layer 20 and the third layer 30. It was found by investigations by the inventors of the application that the on-current (the current value in the on-state) of the memory element 100 becomes large thereby.

Figure 2A:
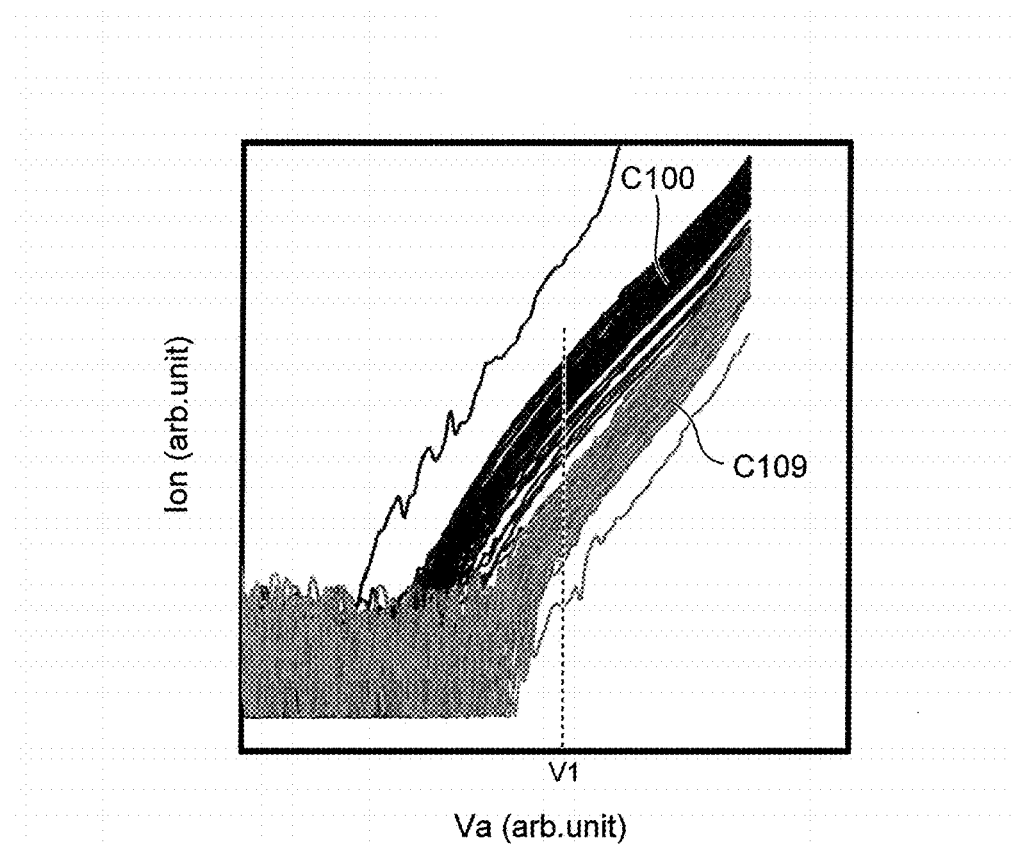
FIG. 2A and FIG. 2B are graphs illustrating characteristics of memory elements.
Figure 2B:
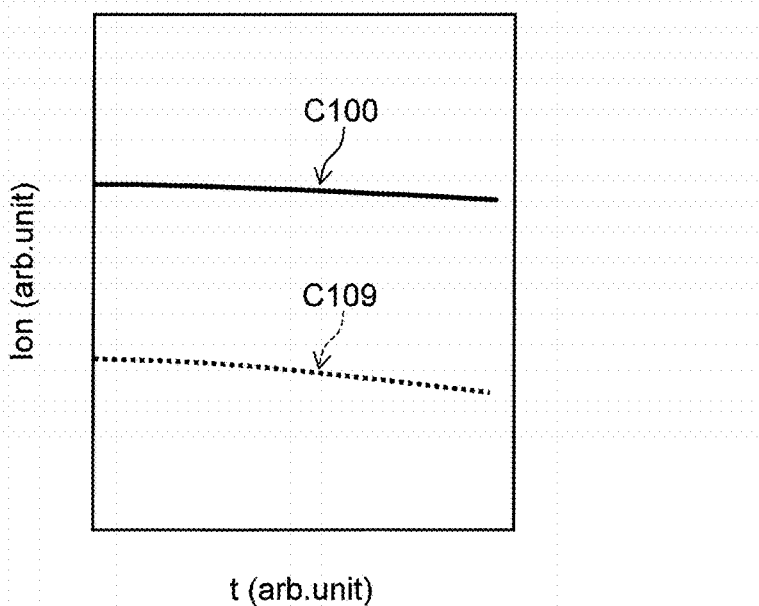

FIG. 2A and FIG. 2B are graphs illustrating characteristics of memory elements.

These figures show a characteristic C100 of the memory element 100 according to the embodiment and a characteristic C109 of a memory element 109 of a reference example.

In the memory element 109 of the reference example, the third region and the first region of the upper electrode each include titanium nitride; and the second region includes titanium. In the memory element 109, for example, the nitrogen concentration in the third region is higher than the nitrogen concentration in the second region. The materials of the second to fourth layers of the memory element 109 are similar to those of the memory element 100.

The horizontal axis of FIG. 2A illustrates a voltage Va (arbitrary units) applied to the memory element 100 or 109, i.e., a voltage applied between the upper electrode and the lower electrode. The vertical axis of FIG. 2A illustrates an on-current Ion (arbitrary units) flowing in the memory element 100 or 109, i.e., a current flowing between the upper electrode and the lower electrode. As shown in FIG. 2A, the on-current (e.g., the current value when the voltage is V1) of the memory element 100 is larger than the on-current of the memory element 109.

The horizontal axis of FIG. 2B illustrates a retention time t (arbitrary units) in the on-state, i.e., the elapsed time from when the memory element is set to the on-state. The vertical axis of FIG. 2B illustrates the on-current Ion (arbitrary units) of the memory element. As shown in FIG. 2B, as time elapses, the decrease of the on-current of the memory element 100 is smaller than the decrease of the on-current of the memory element 109. In other words, the retention characteristics of the memory element 100 are improved compared to the retention characteristics of the memory element 109 of the reference example.

Thus, according to the embodiment, a memory element is provided in which the on-current is large. According to the embodiment, a memory element is provided in which the retention characteristics are improved. For example, it is conjectured that this is because the orientation of the hafnium oxide of the third layer 30 is aligned by the first layer 10 (the third region 13). For example, it is conjectured that the polarization axis of the hafnium oxide is easily aligned with the Z-axis direction.

Figure 3A:
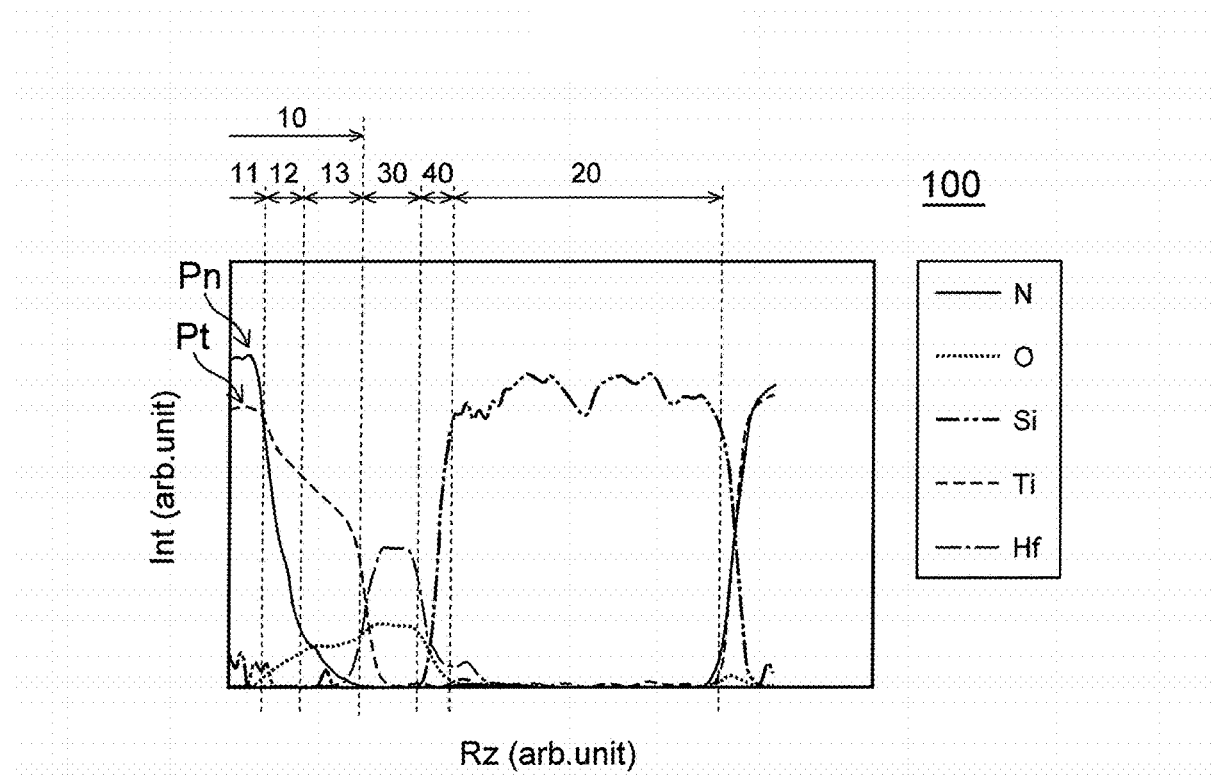
FIG. 3A and FIG. 3B are graphs illustrating analysis data of the memory elements.
Figure 3B:
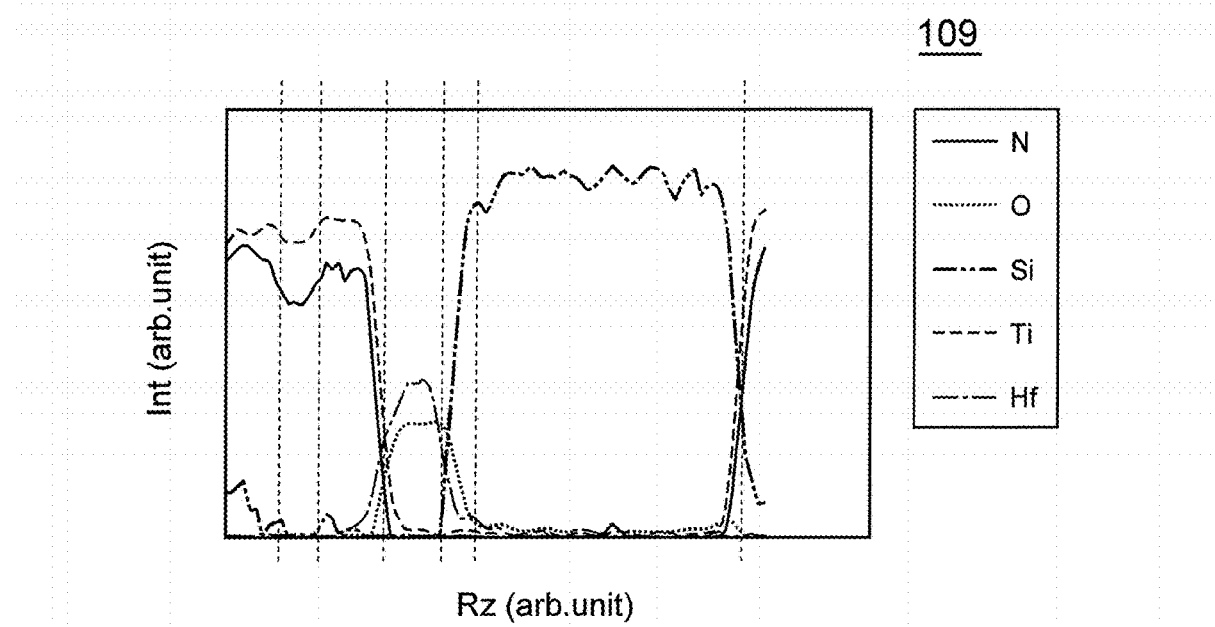

FIG. 3A and FIG. 3B are graphs illustrating analysis data of the memory elements.

FIG. 3A is EELS data of the memory element 100 according to the embodiment. FIG. 3B is EELS data of the memory element 109 of the reference example. The vertical axis illustrates an intensity Int (arbitrary units); and the horizontal axis illustrates a position Rz (arbitrary units) in the Z-axis direction. The scan direction of the EELS measurement is the direction from the first layer 10 toward the second layer 20.

Similarly to the example of FIGS. 2A and 2B, in the memory element 100 of the example, the first region 11 includes titanium nitride; the second region 12 includes titanium; and the third region 13 includes titanium oxide. In other words, nitrogen is used as the first element; and titanium is used as the first metallic element and the second metallic element. The second region 12 of the memory element 100 includes polycrystalline silicon; the third layer 30 includes hafnium oxide; and the fourth layer 40 includes silicon oxide. On the other hand, in the memory element 109, the first region and the third region include titanium nitride; and the second region includes titanium.

As shown in FIG. 3A, a peak Pn (the maximum value) of the nitrogen concentration in the first layer 10 is positioned in the first region 11. The nitrogen concentration in the second region 12 is lower than the nitrogen concentration in the first region 11. The nitrogen concentration in the third region 13 is lower than the nitrogen concentration in the second region.

A peak Pt (the maximum value) of the concentration of titanium in the first layer 10 is positioned in the first region 11. The concentration of titanium in the second region 12 is lower than the concentration of titanium in the first region 11. The concentration of titanium in the third region 13 is lower than the concentration of titanium in the second region 12.

The maximum value of the oxygen concentration in the first layer 10 is positioned in the third region 13. The oxygen concentration in the second region 12 is lower than the oxygen concentration in the third region 13. The oxygen concentration in the first region 11 is lower than the oxygen concentration in the second region. For example, in the first layer 10, the oxygen concentration decreases monotonously along the direction from the third layer 30 toward the first layer 10.

Figure 4A:
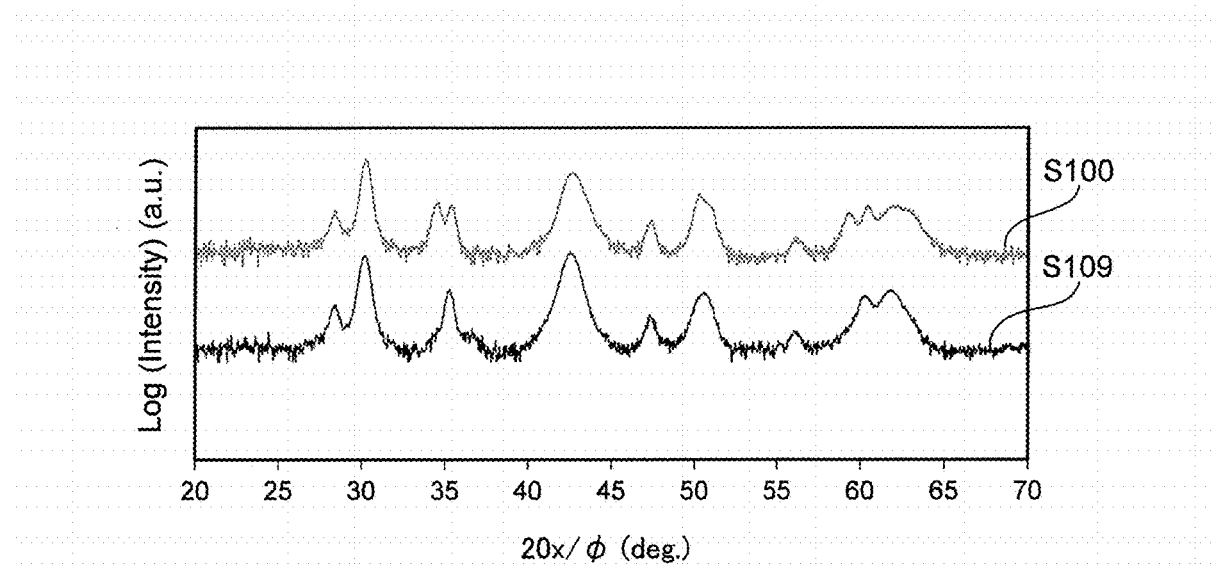
FIG. 4A to FIG. 4C are schematic views illustrating the ferroelectric layers of the memory elements.
Figure 4B:
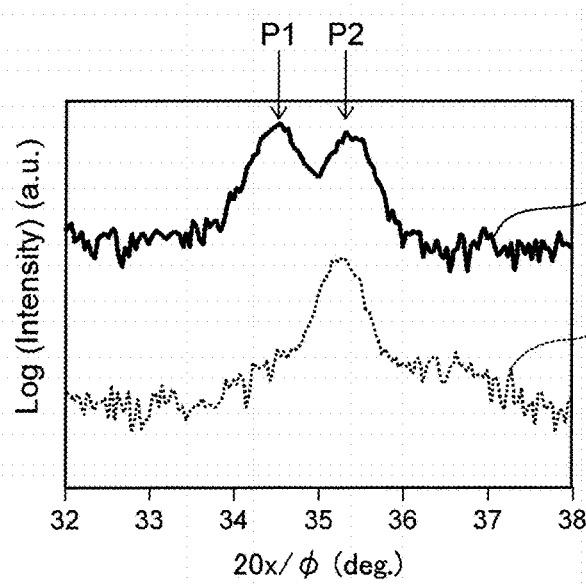
Figure 4C:
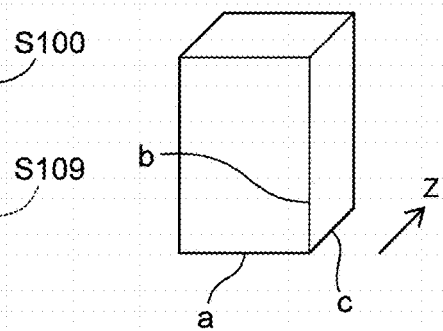

FIG. 4A to FIG. 4C are schematic views illustrating the ferroelectric layers of the memory elements.

FIG. 4A and FIG. 4B illustrate a spectrum S100 of X-ray analysis of the ferroelectric layer (the third layer 30) of the memory element 100 according to the embodiment and a spectrum S109 of X-ray analysis of the ferroelectric layer of the memory element 109 of the reference example. Cu-k α-rays are used in the X-ray analysis shown in FIG. 4A and FIG. 4B.

As shown in FIG. 4A, peaks of the intensity Int are confirmed at the $2\theta\chi/\phi(°)=25°$ vicinity, the $2\theta\chi/\phi(°)=30°$ vicinity, and the $2\theta\chi/\phi(°)=35°$ vicinity. It can be seen that the hafnium oxide included in the third layer 30 has an orthorhombic crystal structure.

In the memory element 100 as shown in FIG. 4B, a peak P1 at the $2\theta\chi/\phi(°)=34$ to 35° vicinity and a peak P2 at the $2\theta\chi/\phi(°)=35$ to 36° vicinity are observed. The peak P1 corresponds to the (020) plane of orthorhombic hafnium oxide. The peak P2 corresponds to the (002) plane and the (200) plane of orthorhombic hafnium oxide. The hafnium oxide that is included in the third layer 30 is, for example, a single orthorhombic phase.

As shown in FIG. 4C, the crystal lattice of hafnium oxide has the a-axis, the b-axis (the long axis), and the c-axis (the polarization axis). In the embodiment, for example, the b-axis is aligned with the X-Y plane (the second direction perpendicular to the Z-axis direction). In other words, the c-axis (the polarization axis) is aligned with the Z-axis direction. Due to the X-ray analysis, it is considered that the proportion of the c-axis oriented in the Z-axis direction is high for the embodiment compared to the reference example.

The third layer 30 includes, for example, silicon. The third layer 30 is, for example, hafnium oxide (HfSiO) to which silicon is added. The concentration of silicon in the third layer 30 is, for example, not less than about 1 atomic percent (at %) and not more than about 10 at %. Thereby, for example, the hafnium oxide easily has a single orthorhombic phase. Other than silicon, the hafnium oxide of the third layer 30 may include at least one element selected from the group consisting of Zr, Al, Y, Sr, La, Ce, Gd, and Ba.

For example, the standard free energy of formation of the oxide of the second metallic element included in the second region 12 is lower than the standard free energy of formation of the oxide of the second element included in the second layer 20. The standard free energy of formation is the free energy of formation when forming an oxide under the conditions of 298.15 K and 1 atmosphere. Elements that have low standard free energies of formation of the oxide are easy to oxidize. In other words, the second region 12 includes the second metallic element that is oxidized more easily than the second element included in the second layer 20.

For example, the second element is silicon; and the second metallic element is titanium. The standard free energy of formation of an oxide of titanium is lower than the standard free energy of formation of an oxide of silicon. Titanium oxidizes more easily than silicon.

The standard free energy of formation of the oxide of the second metallic element included in the second region 12 is lower than the standard free energy of formation of the oxide of the third element included in the fourth layer 40. In other words, the second region 12 includes the second metallic element that is oxidized more easily than the third element included in the fourth layer 40. For example, the third element is silicon; and the second metallic element is titanium.

Thus, the second region 12 includes the second metallic element that is oxidized relatively easily. Thereby, a thick effective film thickness of the variable resistance layer (the fourth layer 40) is suppressed. Thereby, the on-current can be large with respect to the off-current.

An example of a method for manufacturing the memory element 100 according to the embodiment will now be described.

Figures 5A, 5B, 5C:
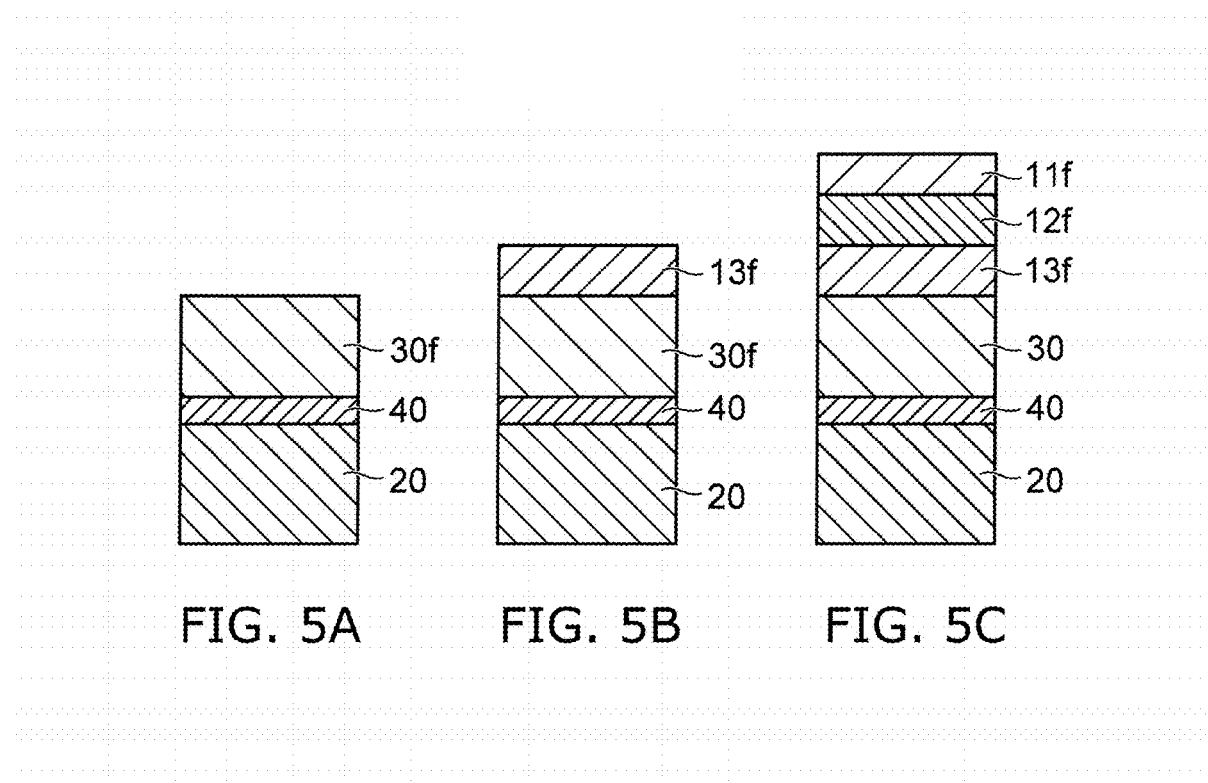
FIG. 5A to FIG. 5C are schematic cross-sectional views in order of the processes, illustrating the method for manufacturing the memory element according to the embodiment.

FIG. 5A to FIG. 5C are schematic cross-sectional views in order of the processes, illustrating the method for manufacturing the memory element according to the embodiment.

As shown in FIG. 5A, the fourth layer 40 is formed on the second layer 20. A hafnium oxide film 30f that is used to form the third layer 30 is formed on the fourth layer 40.

Subsequently, as shown in FIG. 5B, a titanium oxide film 13f that is used to form at least a portion of the third region 13 is formed as a barrier metal on the hafnium oxide film 30f; and, for example, heat treatment is performed at not less than about 600° C. and not more than about 1100° C.

Subsequently, as shown in FIG. 5C, a titanium film 12*f* that is used to form at least a portion of the second region 12 is formed on the titanium oxide film 13*f*. A titanium nitride film 11*f* that is used to form at least a portion of the first region 11 is formed on the titanium film 12*f*. Subsequently, heat treatment is performed at not less than about 600° C. and not more than about 1100° C.; and the memory element 100 is manufactured. By the heat treatment, the hafnium oxide is crystallized; and a ferroelectric is produced.

Desorption of oxygen from the hafnium oxide occurs in the heat treatment. Due to the oxygen, there is a possibility that an oxidation reaction may occur in the second layer 20 and/or the fourth layer 40; and an oxide may be formed. There is a possibility that the variable resistance layer (the fourth layer 40) effectively may become thick according to the thickness of the oxide.

Conversely, in the embodiment, the second region 12 includes the second metallic element having the small standard free energy of formation of the oxide. In the heat treatment, the oxygen that has desorbed from the hafnium oxide reacts easily with the second metallic element. Thereby, the oxidation reactions of the second layer 20 and/or the fourth layer 40 can be suppressed. Accordingly, a thick effective film thickness of the fourth layer 40 can be suppressed.

FIG. 6A to FIG. 6D are schematic perspective views illustrating memory devices according to the embodiment.

The memory devices according to the embodiment are, for example, cross-point nonvolatile memory devices. A stacked body that includes the first layer 10, the second layer 20, the third layer 30, and the fourth layer 40 is used in the nonvolatile memory devices according to the embodiment.

Figure 6A:
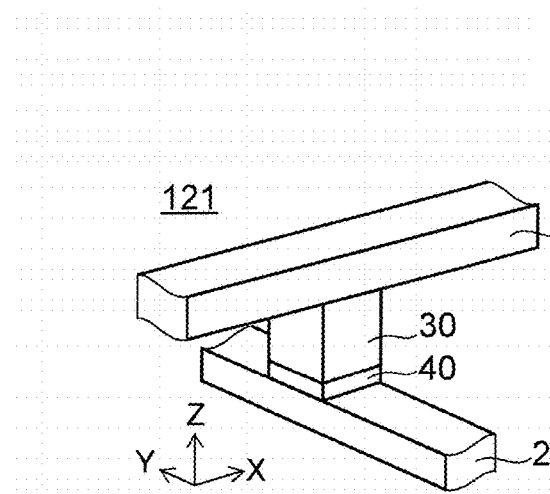
FIG. 6A to FIG. 6D are schematic perspective views illustrating memory devices according to the embodiment.

In a memory device 121 according to the embodiment as shown in FIG. 6A, the first layer 10 extends in the second direction. The second direction is the X-axis direction. For example, the X-axis direction is orthogonal to the Z-axis direction (the stacking direction). The second layer 20 extends in a third direction. The third direction is the Y-axis direction. For example, the Y-axis direction is orthogonal to the X-axis direction and the Z-axis direction.

The third layer 30 overlaps a portion of the first layer 10 when projected onto a plane (the X-Y plane) perpendicular to the Z-axis direction. The third layer 30 overlaps a portion of the second layer 20 when projected onto the X-Y plane. The third layer 30 overlaps the region where the first layer 10 and the second layer 20 overlap when projected onto the X-Y plane.

In the example, the first layer 10 is used as one interconnect; and the second layer 20 is used as one other interconnect. The third layer 30 is provided at the position where these interconnects cross.

Figure 6B:
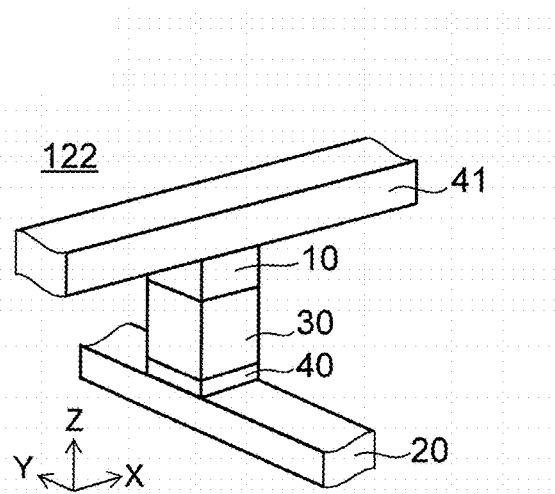

As shown in FIG. 6B, a first interconnect 41 is provided in a memory device 122. The first interconnect 41 extends in the X-axis direction. The second layer 20 extends in the Y-axis direction. The third layer 30 overlaps a portion of the second layer 20 when projected onto the X-Y plane. The third layer 30 and the first layer 10 are provided between the first interconnect 41 and the second layer 20. The first layer 10, the third layer 30, and the second layer 20 overlap a portion of the first interconnect 41 when projected onto the X-Y plane.

Figure 6C:
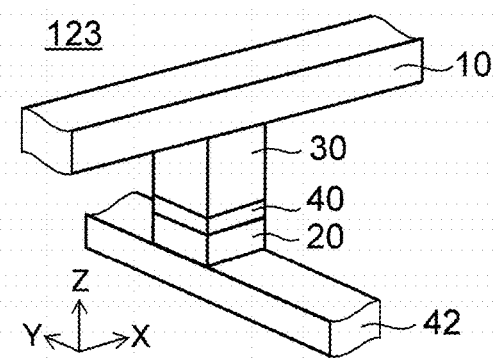

As shown in FIG. 6C, a second interconnect 42 is provided in a memory device 123. The second interconnect 42 extends in the Y-axis direction. The first layer 10 extends in the X-axis direction. The third layer 30 overlaps a portion of the first layer 10 when projected onto the X-Y plane. The third layer 30 and the second layer 20 are provided between the second interconnect 42 and the first layer 10. The first layer 10, the third layer 30, and the second layer 20 overlap a portion of the second interconnect 42 when projected onto the X-Y plane.

Figure 6D:
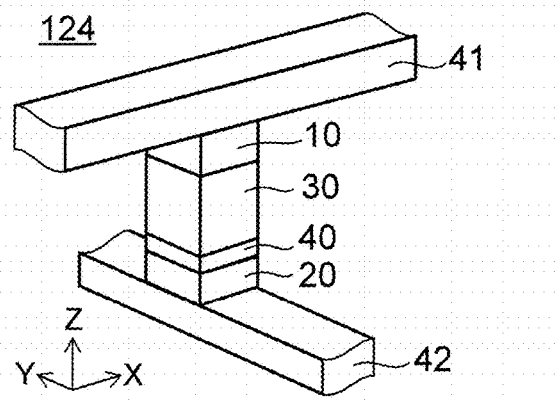

As shown in FIG. 6D, the first interconnect 41 and the second interconnect 42 are provided in a memory device 124. The first interconnect 41 extends in the X-axis direction. The second interconnect 42 extends in the Y-axis direction. The first layer 10, the third layer 30, and the second layer 20 are disposed between the first interconnect 41 and the second interconnect 42.

In the embodiment, at least one of the first layer 10 or the second layer 20 may be used as an interconnect. An interconnect (at least one of the first interconnect 41 or the second interconnect 42) may be provided separately from the first layer 10 and the second layer 20.

The stacked film that includes the third layer 30 may have a prism configuration or a circular columnar configuration (including a flattened circular configuration).

Figure 7:
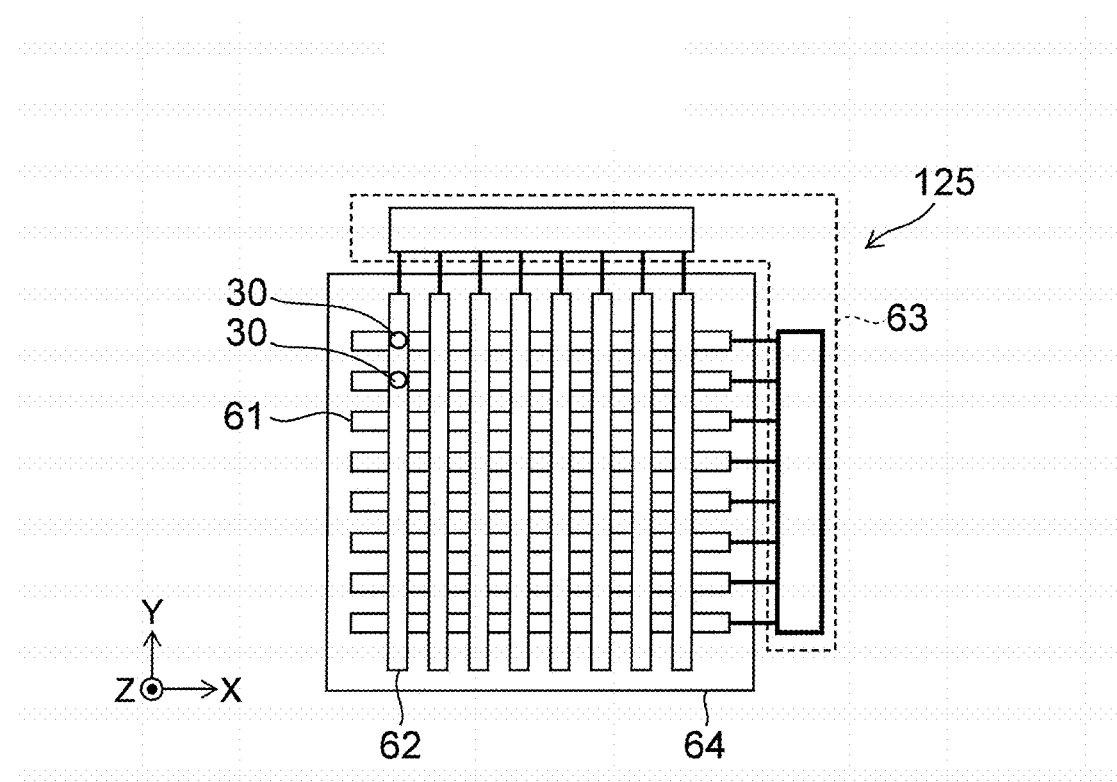
FIG. 7 is a schematic plan view illustrating the memory device according to the embodiment.

FIG. 7 is a schematic plan view illustrating the memory device according to the embodiment.

As shown in FIG. 7, multiple interconnects 61 and multiple interconnects 62 are provided in the memory device 125. The multiple interconnects 61 are parallel to each other. The multiple interconnects 62 are parallel to each other. The direction in which the interconnects 61 extend crosses the direction in which the interconnects 62 extend. For example, the interconnect 61 includes the first layer 10 or the first interconnect 41. For example, the interconnect 62 includes the second layer 20 or the second interconnect 42. For example, the interconnects 61 are used as word lines. For example, the interconnects 62 are used as bit lines.

Multiple stacked bodies (at least the third layers 30) are provided respectively at the crossing portions between the multiple interconnects 61 and the multiple interconnects 62. The interconnects 61 and the interconnects 62 are connected to a controller 63 (a control circuit). One of the multiple third layers 30 is set to a selected state by the interconnects 61 and the interconnects 62; and the desired operation is performed. The memory device 125 is a cross-point resistance random access memory.

A substrate 64 is provided in the memory device 125. The interconnects 61 and the interconnects 62 are provided on the substrate 64. The stacking order of the stacked body including the first layer 10, the third layer 30, and the second layer 20 is arbitrary. For example, the second layer 20 may be disposed between the substrate 64 and the first layer 10. On the other hand, the first layer 10 may be disposed between the substrate 64 and the second layer 20. The Z-axis direction may cross the major surface of the substrate 64.

Multiple stacked bodies (the first layer 10, the third layer 30, and the second layer 20) may be stacked. In other words, the embodiment is applicable to a cross-point memory having a three-dimensionally stacked structure.

Figure 8:
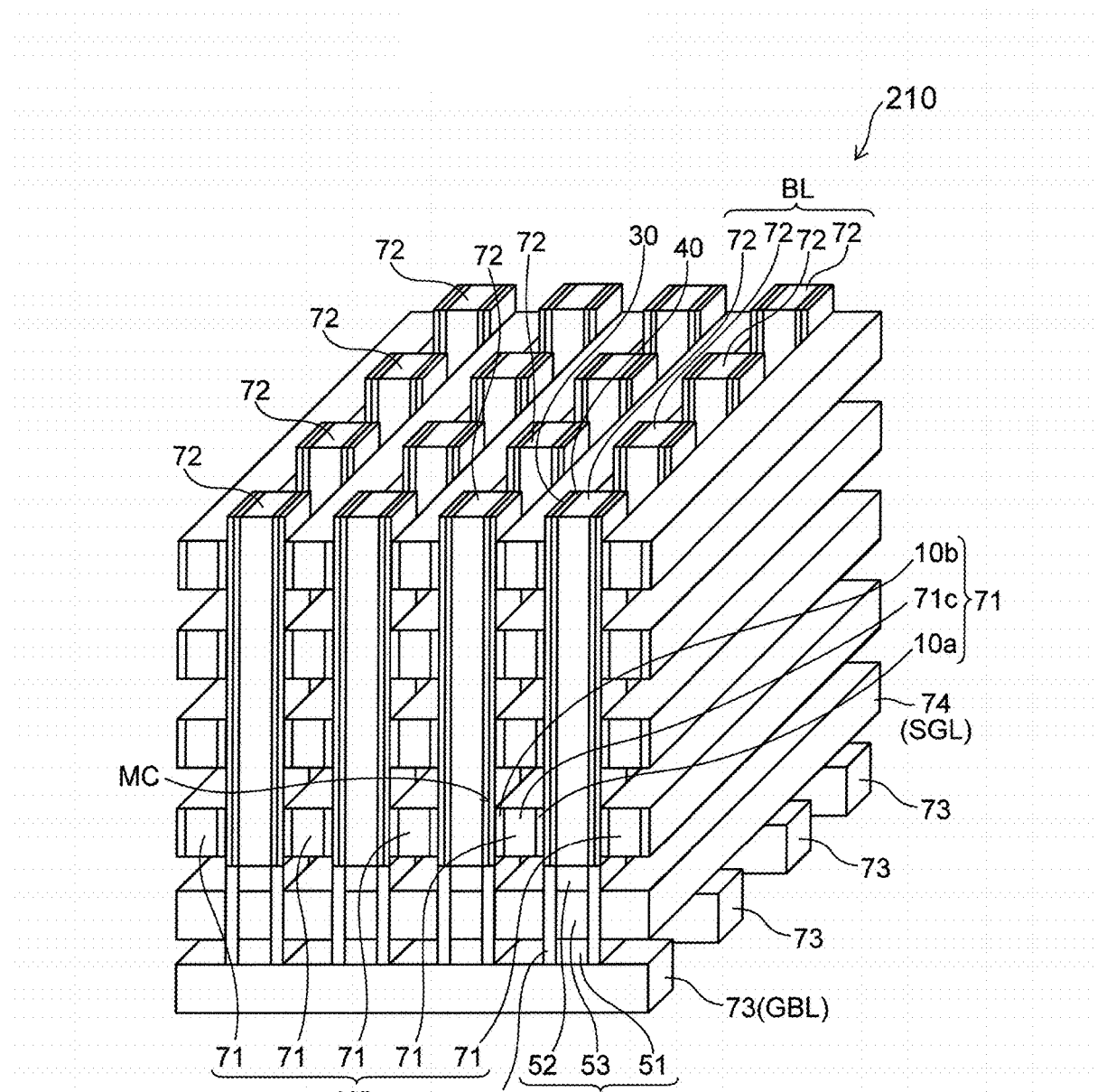
FIG. 8 is a schematic perspective view illustrating a memory device according to an embodiment.

FIG. 8 is a schematic perspective view illustrating a memory device according to an embodiment.

Some of the insulating portions are not illustrated in FIG. 8.

As shown in FIG. 8, multiple first interconnects 71 and multiple second interconnects 72 are provided in the memory device 210 according to the embodiment. The memory device 210 further includes multiple third interconnects 73 and multiple fourth interconnects 74.

The multiple first interconnects 71 are arranged in the third direction (e.g., the Y-axis direction) and the first direction (e.g., the Z-axis direction). The multiple first interconnects 71 are substantially parallel to each other. The first interconnect 71 includes, for example, the first layer 10 or the first interconnect 41. In the example, the first interconnect 71 is a stacked body of the first layer 10 and a conductive portion 71c.

The multiple second interconnects 72 are arranged in the second direction (e.g., the X-axis direction) and the first direction (e.g., the Z-axis direction). The multiple second interconnects 72 are substantially parallel to each other. The second interconnect 72 includes, for example, the second layer 20 or the second interconnect 42. In the example, the second interconnect 72 includes the second layer 20.

One of the multiple third interconnects 73 extends in the first direction (e.g., the Z-axis direction). The multiple third interconnects 73 are arranged in the X-axis direction. The multiple third interconnects 73 are substantially parallel to each other.

One of the multiple fourth interconnects 74 extends in the second direction (e.g., the X-axis direction). The multiple fourth interconnects 74 are arranged in the Z-axis direction. The multiple fourth interconnects 74 are substantially parallel to each other.

For example, the multiple first interconnects 71 correspond to word lines WL. For example, the multiple second interconnects 72 correspond to local bit lines BL. The multiple third interconnects 73 correspond to global bit lines GBL. The multiple fourth interconnects 74 correspond to selection gate lines SGL.

A semiconductor region 55 and an insulating film 551 are provided in the memory device 210. Multiple semiconductor regions 55 and multiple insulating films 551 are provided. One of the multiple semiconductor regions 55 is provided between one of the multiple second interconnects 72 and one of the multiple third interconnects 73. The semiconductor region 55 functions as a portion of a selection transistor. The fourth interconnect 74 functions as a gate electrode of the selection transistor. The insulating film 551 functions as a gate insulating film of the selection transistor.

The fourth interconnects 74 are positioned between the multiple first interconnects 71 and a portion of the third interconnects 73 in the third direction (e.g., the Y-axis direction). The insulating film 551 is provided between the semiconductor region 55 and a portion of the fourth interconnects 74 in the first direction (e.g., the Z-axis direction).

A first portion 51 of the semiconductor region 55 is connected to one of the multiple third interconnects 73. A second portion 52 of the semiconductor region 55 is connected to one of the multiple second interconnects 72. The first portion 51 is one of a source or a drain of the selection transistor. The second portion 52 is the other of the source or the drain of the selection transistor. The semiconductor region 55 further includes a third portion 53. The third portion 53 is positioned between the first portion 51 and the second portion 52. The third portion 53 is a channel portion of the selection transistor.

Memory cells MC are positioned respectively at the crossing portions between the multiple first interconnects 71 and the multiple second interconnects 72. The memory cells MC are arranged in the X-axis direction, the Y-axis direction, and the Z-axis direction. The memory cell MC is, for example, the portion where the first layer 10, the second layer 20, the third layer 30, and the fourth layer 40 are stacked. The memory cell MC includes at least the third layer 30.

By a voltage applied to the fourth interconnects 74, the selection transistors are switched ON; and one of the multiple second interconnects 72 corresponding to one of the multiple third interconnects 73 is selected. One of the multiple memory cells MC is selected according to the voltages applied to the multiple first interconnects 71. A voltage is applied between the first layer 10 and the second layer 20. Thereby, switching between the on-state and the off-state (a program operation and an erase operation) is performed. The on-state and the off-state are discriminated according to the electrical resistance between the first layer 10 and the second layer 20 (a read operation).

Figure 9:
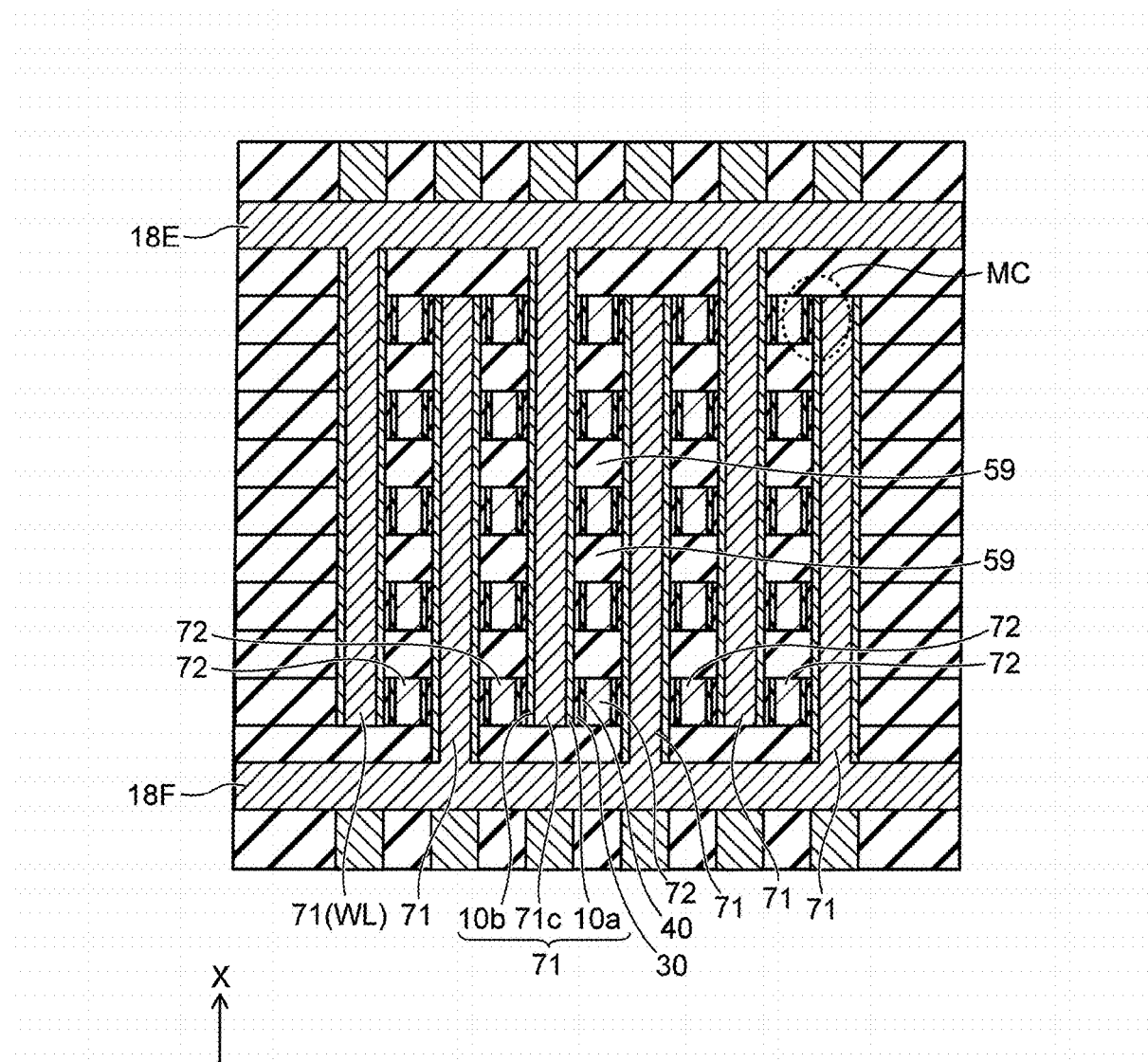
FIG. 9 is a schematic cross-sectional view illustrating a portion of the memory device according to the embodiment.

FIG. 9 is a schematic cross-sectional view illustrating a portion of the memory device according to the embodiment.

FIG. 9 is a cross-sectional view when the memory device 210 is cut by the Z-X plane.

As shown in FIG. 9, a first insulating region 59 is provided in the memory device 210. For example, the first insulating region 59 corresponds to an inter-layer insulating film.

The multiple second interconnects 72 are arranged in the X-axis direction and the Y-axis direction. The first insulating region 59 is provided between the multiple second interconnects 72. For example, a group (a first group) of a portion of the multiple second interconnects 72 is arranged in the second direction (e.g., the X-axis direction). At least a portion of the first insulating region 59 is positioned between the multiple second interconnects 72 included in the first group. One first layer 10 (a first layer 10a) of the multiple first interconnects 71 is provided between the conductive portion 71c and the at least a portion of the first insulating region 59 recited above (the portion between the multiple second interconnects 72). In other words, the one first layer 10 (the first layer 10a) of the multiple first interconnects 71 extends in the Y-axis direction with the conductive portion 71c.

As shown in FIG. 9, the multiple first interconnects 71 are connected in a comb teeth configuration by a fifth interconnect 18E and a sixth interconnect 18F. The fifth interconnect 18E and the sixth interconnect 18F extend in the first direction (e.g., the Z-axis direction). The sixth interconnect 18F is separated from the fifth interconnect 18E in the second direction (e.g., the X-axis direction).

The multiple first interconnects 71 are provided between the fifth interconnect 18E and the sixth interconnect 18F. The multiple first interconnects 71 are arranged in the first direction (e.g., the Z-axis direction). Two of the multiple first interconnects 71 are connected to the fifth interconnect 18E. On the other hand, another one of the multiple first interconnects 71 is between the two of the multiple first interconnects 71 recited above in the first direction (e.g., the Z-axis direction). The one of the multiple first interconnects 71 recited above (the other one recited above) is connected to the sixth interconnect 18F. For example, the odd-numbered interconnects of the multiple first interconnects 71 are connected to the fifth interconnect 18E. The even-numbered interconnects of the multiple first interconnects 71 are connected to the sixth interconnect 18F.

One of the multiple first interconnects 71 is positioned between two of the multiple second interconnects 72 arranged along the Z-axis direction. In this first interconnect 71, the conductive portion 71c is positioned between two first layers 10 (the first layer 10a and a first layer 10b) arranged in the Z-axis direction.

The first layer 10b extends in the second direction (e.g., the X-axis direction). The first layer 10a is positioned between the conductive portion 71c and a portion of one of the two of the multiple second interconnects 72 recited above in the first direction (e.g., the Z-axis direction). The first layer 10b is positioned between the conductive portion 71c and a portion of the other one of the two of the multiple second interconnects 72 recited above in the first direction (the Z-axis direction).

The third layer 30 and the fourth layer 40 are provided in a region including the conductive portion 71c and a portion of one of the two of the multiple second interconnects 72 recited above. This portion is used as one of the multiple memory cells MC.

Another third layer 30 and another fourth layer 40 are provided in a region including the conductive portion 71c and a portion of the other one of the two of the multiple second interconnects 72 recited above. This portion is used as another one of the multiple memory cells MC.

Figure 10:
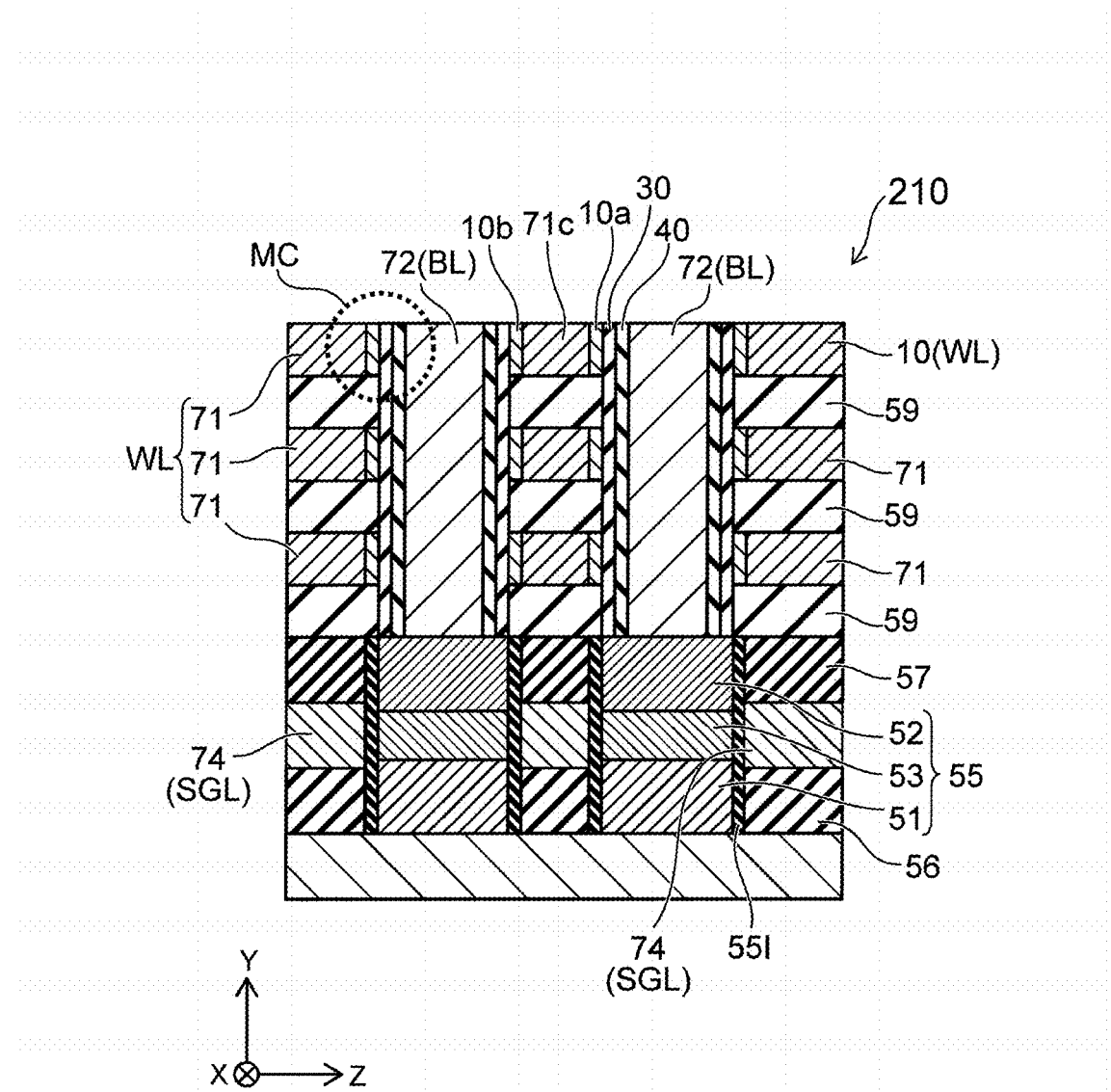
FIG. 10 is a schematic cross-sectional view illustrating a portion of the memory device according to the embodiment.

FIG. 10 is a schematic cross-sectional view illustrating a portion of the memory device according to the embodiment.

FIG. 10 is a cross-sectional view when the memory device 210 is cut by the Y-Z plane.

The multiple semiconductor regions 55 are provided on the third interconnect 73. The multiple semiconductor regions 55 and the multiple fourth interconnects 74 are arranged alternately along the Z-axis direction. The fourth interconnect 74 is positioned between second insulating regions 56 and 57 in the Z-axis direction. The second insulating regions 56 and 57 correspond to inter-layer insulating films.

The multiple first interconnects 71 are arranged in the Y-axis direction. The first insulating region 59 is provided between the multiple first interconnects 71.

One of the multiple first interconnects 71 is provided between the multiple second interconnects 72 arranged in the Z-axis direction. The multiple first interconnects 71 are arranged in the Y-axis direction. The memory cells MC are provided at the crossing portions between the multiple second interconnects 72 and the multiple first interconnects 71.

In such a memory device 210, the direction of the current flowing in one memory cell MC is, for example, the Z-axis direction. The short length of one memory cell MC in the Z-axis direction leads to a high density memory device.

According to the embodiments, a memory element can be provided in which the on-current is large.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, embodiments of the invention are described with reference to specific examples. However, the invention is not limited to these specific examples. For example, one skilled in the art may similarly practice the invention by appropriately selecting specific configurations of components such as the first layer, the second layer, and the third layer, etc., from known art; and such practice is within the scope of the invention to the extent that similar effects can be obtained.

Further, any two or more components of the specific examples may be combined within the extent of technical feasibility and are included in the scope of the invention to the extent that the purport of the invention is included.

Moreover, all memory elements practicable by an appropriate design modification by one skilled in the art based on the memory elements described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A memory element, comprising:
a first layer, the first layer being conductive;
a second layer, the second layer being conductive; and
a third layer including hafnium oxide and being provided between the first layer and the second layer,
the first layer including
a first region including a first element and a first metallic element, the first element being selected from a group consisting of carbon and nitrogen,
a second region including a second metallic element and being provided between the first region and the third layer, and
a third region including titanium oxide and being provided between the second region and the third layer.

2. The memory element according to claim 1, wherein the second region includes oxygen, and
an oxygen concentration in the third region is higher than an oxygen concentration in the second region.

3. The memory element according to claim 1, wherein the third region does not include the first element, or the third region includes the first element, and a concentration of the first element in the third region is lower than a concentration of the first element in the first region.

4. The memory element according to claim 1, wherein the third layer includes silicon.

5. The memory element according to claim 1, wherein hafnium oxide includes orthorhombic.

6. The memory element according to claim 1, wherein a long axis of a crystal lattice of the hafnium oxide is aligned with a second direction perpendicular to a first direction, the first direction being from the second layer toward the first layer.

7. The memory element according to claim 1, wherein the first metallic element includes at least one selected from the group consisting of titanium, tantalum, and tungsten.

8. The memory element according to claim 1, wherein the second metallic element includes at least one selected from the group consisting of titanium, cerium, europium, zirconium, barium, aluminum, hafnium, strontium, lanthanum, magnesium, neodymium, ytterbium, samarium, dysprosium, lutetium, holmium, thulium, erbium, calcium, and yttrium.

9. The memory element according to claim 1, wherein the second layer includes a second element, and
a standard free energy of formation of an oxide of the second metallic element is lower than a standard free energy of formation of an oxide of the second element.

10. The memory element according to claim 1, further comprising a fourth layer including a third element and being provided between the second layer and the third layer, a standard free energy of formation of an oxide of the second metallic element being lower than a standard free energy of formation of an oxide of the third element.

11. The memory element according to claim 2, wherein the first region does not include oxygen, or
the first region includes oxygen, and an oxygen concentration in the first region is lower than the oxygen concentration in the second region.

12. The memory element according to claim 3, wherein the second region includes the first element, and a concentration of the first element in the second region is higher than the concentration of the first element in the third region and lower than the concentration of the first element in the first region.

13. The memory element according to claim 1, wherein the first element is nitrogen,
the first metallic element is titanium, and
the second metallic element is titanium.

14. The memory element according to claim 13, wherein the second region includes nitrogen,
the third region includes nitrogen,
a nitrogen concentration in the second region is lower than a nitrogen concentration in the first region, and
a nitrogen concentration in the third region is lower than the nitrogen concentration in the second region.

15. The memory element according to claim 13, wherein a titanium concentration in the second region is lower than a titanium concentration in the first region, and
a titanium concentration in the third region is lower than the titanium concentration in the second region.

16. The memory element according to claim 13, wherein the first region includes oxygen,
the second region includes oxygen,
an oxygen concentration in the second region is lower than an oxygen concentration in the third region, and
an oxygen concentration in the first region is lower than the oxygen concentration in the second region.

17. The memory element according to claim 1, wherein the second layer includes silicon, and
the second metallic element is titanium.

18. The memory element according to claim 1, further comprising a fourth layer including silicon and being provided between the second layer and the third layer,
the second metallic element being titanium.

* * * * *